United States Patent
Grannen et al.

(10) Patent No.: US 6,286,453 B1
(45) Date of Patent: Sep. 11, 2001

(54) SHIELD DESIGN FOR IBC DEPOSITION

(75) Inventors: Kevin John Grannen, Fremont; Jeffrey Arthur McCann, Tracy; Xiaoding Ma, Fremont; Jing Gui, Fremont; Mark Anthony Shows, Fremont, all of CA (US)

(73) Assignee: Seagate Technologies, Inc., Scotts Valley, CA (US)

( * ) Notice: Subject to any disclaimer, the term of this patent is extended or adjusted under 35 U.S.C. 154(b) by 0 days.

(21) Appl. No.: 09/532,620

(22) Filed: Mar. 22, 2000

Related U.S. Application Data

(60) Provisional application No. 60/126,374, filed on Mar. 26, 1999.

(51) Int. Cl.$^7$ ............................... C23C 16/00; H05H 1/00
(52) U.S. Cl. ...................... 118/723 FI; 156/345
(58) Field of Search ........................... 118/723 FI, 723 E, 118/723 MW, 723 MR, 723 ME, 715; 427/585; 156/345

(56) References Cited

U.S. PATENT DOCUMENTS 5,858,477 * 1/1999 Veerasamy et al. ................. 427/562
6,027,619 * 2/2000 Cathey et al. .................. 204/192.38

\* cited by examiner

*Primary Examiner*—Gregory Mills
*Assistant Examiner*—P. Hassanzadeh
(74) *Attorney, Agent, or Firm*—Joseph Levi, Esq.; Clifford Chance Rogers & Wells LLP

(57) ABSTRACT

A device for reducing the contamination of a disc being coated during an ion beam deposition process. The ion beam deposition process is performed in a chamber having an upper portion and a lower portion with the disc being disposed in the lower portion of the chamber. An ion source is introduced into the lower chamber for generating an ion beam for depositing ions on the disc. In the upper portion of the chamber is a pump for creating negative pressure in the chamber. A portion of the ion beam contacts the pump forming contaminants on the pump which cause the contamination of the disc. A baffle assembly is disposed in the chamber between the pump and the ion source. Said baffle assembly includes a baffle that reduces the portion of the ion beam contacting said pump thereby reducing the forming of contaminants on the pump. The baffle assembly also includes a baffle cap disposed above the disc so that when the contaminants dislodge from the pump, the baffle cap prevents the contaminants from contaminating said disc.

3 Claims, 2 Drawing Sheets

SHIELD DESIGN FOR IBC DEPOSITION

This application claims benefit of Provisional Appln. 60/126,374 filed Mar. 26, 1999.

BACKGROUND

The following invention relates to magnetic discs and, in particular, a device for improving the yield of magnetic discs coated with carbon using ion beam deposition.

Magnetic discs are generally used for storing data in magnetizable form. Typically, one or more disks are rotated on a central axis in combination with data transducing heads positioned in close proximity to the recording surfaces of the disks and moved generally radially with respect thereto. Magnetic disks are usually housed in a magnetic disk unit in a stationary state with a magnetic head having a specific load elastically in contact with and pressed against the surface of the disk.

It is desirable during reading and recording operations to maintain each transducing head as close to the corresponding recording surface as possible, i.e., to minimize the flying height of the head. This is particularly important when the areal recording density of the magnetic media increases. (The areal density (Mbits/in.sup.2) is the recording density per unit area and is equal to the track density (TPI) in terms of tracks per inch times (×) the linear density (BPI) in terms of bits per inch). Thus, a smooth recording surface is preferred, as well as a smooth opposing surface of the associated transducing head, so that the head and the disk can be positioned in close proximity to each other.

A typical magnetic disc is comprised of a substrate, typically an aluminum (Al)-base alloy, such as an aluminum-magnesium (Al—Mg) alloy, plated with a layer of amorphous nickel-phosphorous (NiP). Deposited on the substrate is a chromium (Cr) underlayer, a cobalt (Co)-base alloy magnetic layer, a protective carbon overcoat and a lubricant topcoat. The Cr underlayer, the Co-base alloy magnetic layer and the protective carbon overcoat are typically deposited using sputtering techniques.

The efficiency of the magnetic disc manufacturing process is determined by the yield performance of the process. The yield performance is comprised of two factors: glide yield and certification yield. The glide yield is determined by flying a head over the disc surface at a predetermined height, typically below 1 microinch. If the head "hits" the disc surface, the disc is rejected. Discs that pass the glide test are then subjected to a certification test in which magnetic information is written to the disc. The information is then read from the disc and compared to the previously written information. If the comparison fails beyond an acceptable threshold, then the disc has failed the certification test and is rejected. Certification defects are caused by a number of factors including substrate defects, blisters from ineffective cleaning, or environmental contaminants on the disc surface before the sputter deposition of the chromium and magnetic layers.

The process of depositing a carbon film on a magnetic disc traditionally involved sputtering a carbon target with a mixture of argon and hydrogen gas. Recently, an emerging technology called ion beam deposition has been used to deposit carbon film on a magnetic disc.

Referring now to FIG. 1, there is shown an Intevac MDP 250 deposition machine 1 used for ion beam deposition. Deposition machine 1 includes a turbomolecular pump 3 placed on a process chamber 9. Process chamber 9 is mounted on a process station 5. Inside process station 5 is a carousel (not shown) that includes a disc pedestal on which a disc to be carbon coated is placed. An ion source 7, typically operating on a feed of hydrocarbon and argon gas, is introduced into process chamber 9.

In operation, the disc is positioned in process chamber 9. Ion source 7, which generates an ion beam consisting of positively charged ions of argon and hydrocarbon, is propelled towards the disc by the pumping pressure of turbomolecular pump 3 and coats the disc. The ion beam deposition process requires high gas flows (to ion source 7) and low pressures (created by turbomolecular pump 3) in order to deposit at a rate sufficient for manufacturing throughput. This combination necessitates high pumping capacity in process chamber 9.

A drawback of the prior art ion deposition process is that some residual ions and neutrals also deposit onto the vanes and stators of turbomolecular pump 3. After a sufficient amount of deposition onto the vanes and stators, the deposits flake off and fall into process chamber 9. These deposits may cause the disc to become contaminated thereby greatly reducing the yield performance of the ion deposition process.

SUMMARY OF THE INVENTION

The present invention is directed to a device for reducing the contamination of a disc being coated during an ion beam deposition process. The ion beam deposition process is performed in a chamber having an upper portion and a lower portion with the disc being disposed in the lower portion of the chamber. An ion source is introduced into the lower chamber for generating an ion beam for depositing ions on the disc. In the upper portion of the chamber is a pump for creating negative pressure in the chamber. A portion of the ion beam contacts the pump forming contaminants on the pump which cause the contamination of the disc. The device of the present invention includes a baffle assembly that is disposed in the chamber between the pump and the ion source. Said baffle assembly includes a baffle that reduces the portion of the ion beam contacting said pump thereby reducing the forming of contaminants on the pump. The baffle assembly also includes a baffle cap positioned above the disc so that when the contaminants dislodge from the pump, the baffle cap prevents the contaminants from contaminating said disc.

The invention accordingly comprises the features of construction, combination of elements and arrangement of parts which will be exemplified in the following detailed disclosure, and the scope of the invention will be indicated in the claims.

BRIEF DESCRIPTION OF THE DRAWINGS

For a fuller understanding of the invention, reference is had to the following description taken in conjunction with the accompanying drawings, in which.

DETAILED DESCRIPTION OF THE PREFERRED EMBODIMENTS

Figure 1:
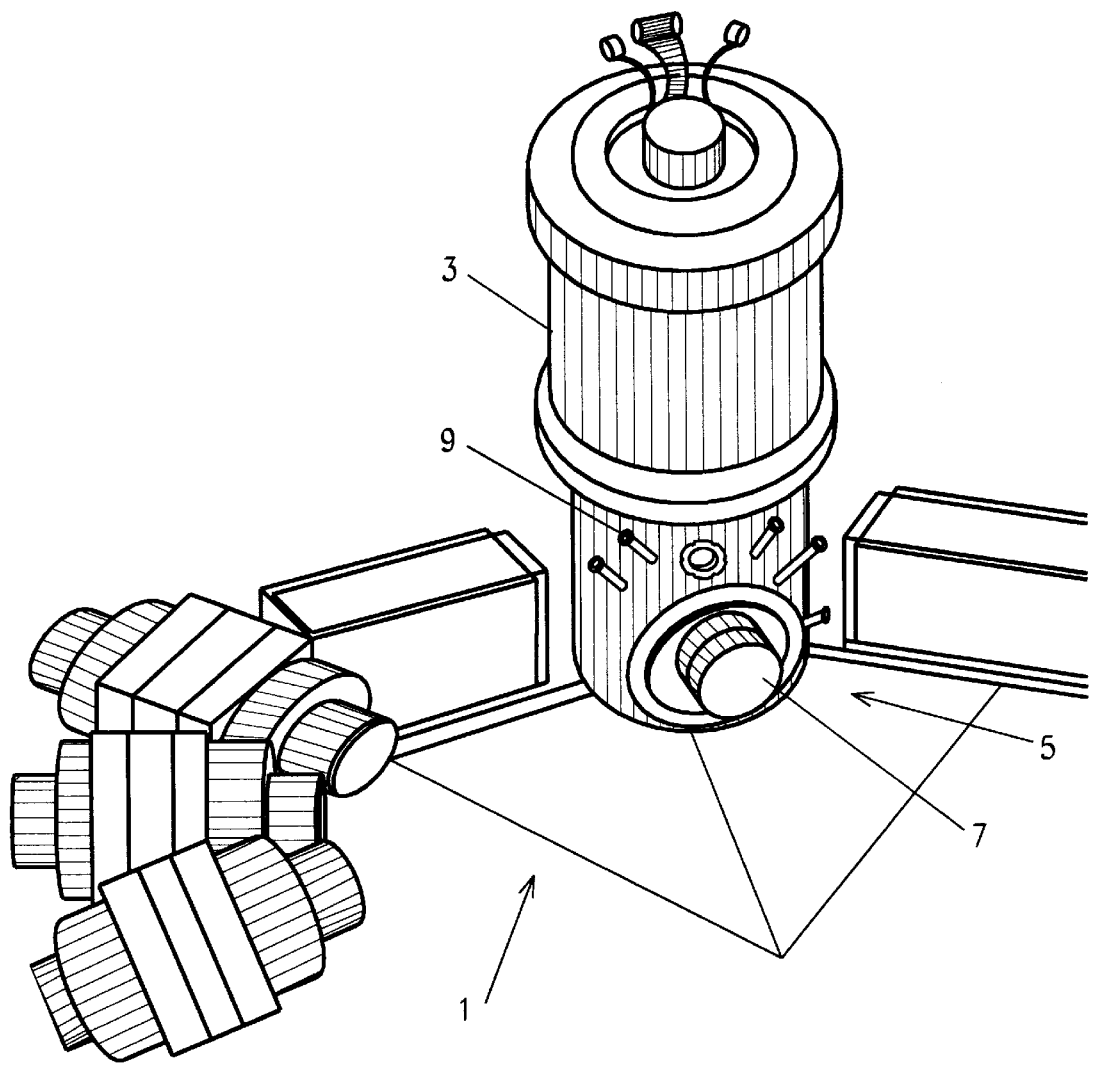
FIG. 1 is a prior art ion beam deposition machine.
Figure 2:
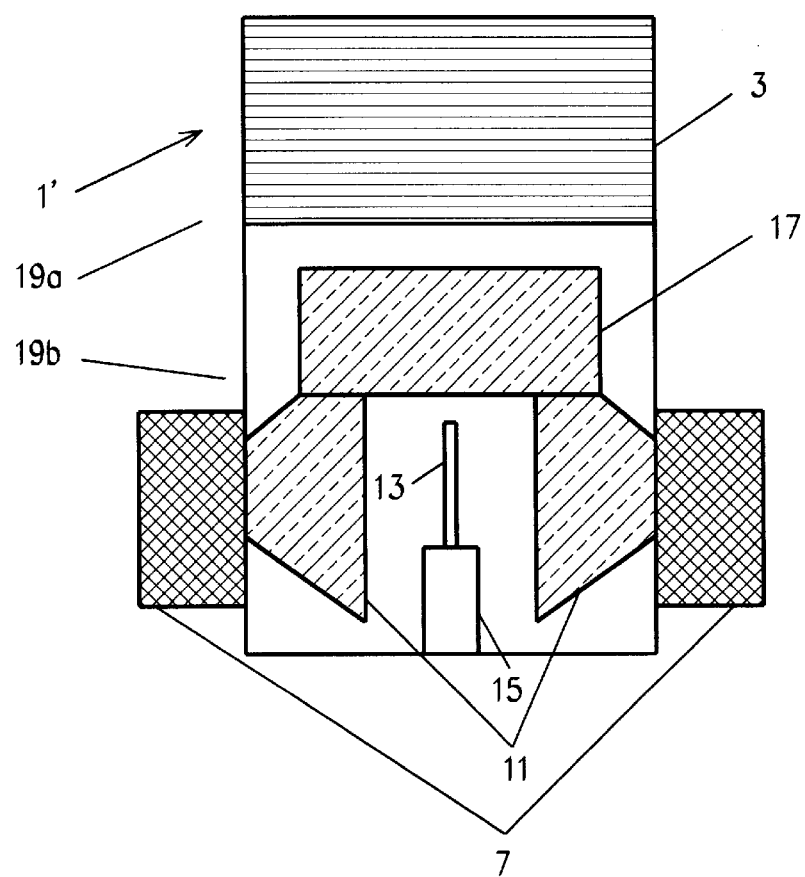
FIG. 2 is an ion beam deposition machine of the present invention.
Figure 3:
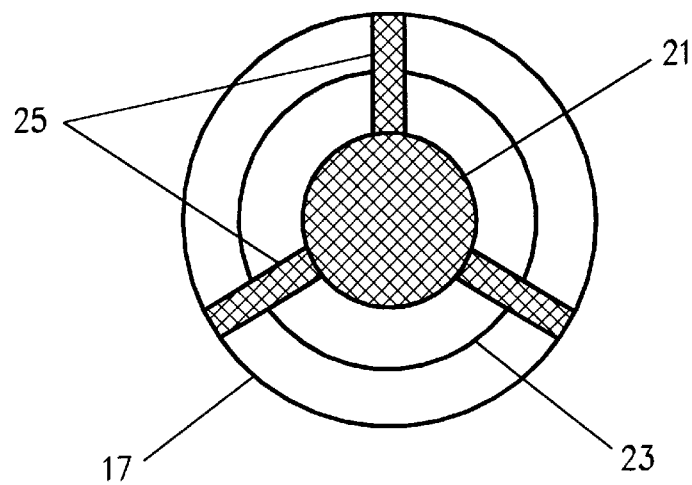
FIG. 3 is a top view of the baffle assembly used in the ion beam deposition machine of FIG. 2.

Referring now to FIGS. 2–3, there is shown an ion beam deposition machine 1' of the present invention. Deposition machine 1' includes a chamber 19 having an upper portion 19*a* and a lower portion 19*b*. Disposed in upper chamber 19*a* is a turbomolecular pump 3 for creating a negative pressure in chamber 19 that is required for the ion beam deposition process according to techniques well know in the art. Disposed in lower chamber 19*b* is a pedestal 15 that receives a disc 13 that is to be coated by deposition machine 1'. An ion source 7 is introduced into lower chamber 19*b* at a point adjacent to disc 13. Ion source 7 generates an ion beam 11 that deposits ions on disc 13.

To prevent line-of-sight deposition of the ions onto the vanes and stators (not shown) of turbomolecular pump 3 that cause contaminants to be formed on pump 3, a baffle assembly 17 is disposed in chamber 19 between pump 3 and ion source 7. Baffle assembly 17 includes a baffle 23 that consists of concentric rings held in place by a plurality of bars 25. Baffle 23 reduces the line-of-sight deposition of ions onto pump 3 while only slightly reducing the pumping throughout in chamber 19 generated by pump 3. By reducing the line-of-sight deposition of ions onto pump 3, the amount of contamination buildup on pump 3 is reduced thereby reducing the likelihood of contaminants contaminating disc 13.

Baffle assembly 17 also includes a solid baffle cap 21 that is positioned in the center of baffle 21 directly above disc 13. The contaminants that dislodge from pump 3 and fall within the diameter of baffle cap 21 are captured and prevented from falling into lower portion 19*b* of chamber 19 and contaminating disc 13. As a result, the likelihood of disc 13 becoming contaminated by contaminants falling from pump 3 is greatly reduced.

It will thus be seen that the objects set forth above, among those made apparent from the preceding description, are efficiently attained and, because certain changes may be made in the construction set forth above without departing from the spirit and scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A device for reducing the contamination of a disc being coated during an ion beam deposition process, said ion beam deposition process being performed in a chamber having an upper portion and a lower portion, said disc having surfaces and being disposed in said lower portion of said chamber, said lower chamber having an ion source being positioned adjacent to and in facing relationship with said surfaces of said disc, said ion source generating an ion beam for depositing material on said disc, said upper portion of said chamber having a pump for creating negative pressure in said chamber, wherein a portion of said ion beam contacts said pump forming contaminants on said pump, said contaminants causing the contamination of said disc, said device comprising.

2. The device of claim 1, wherein said baffle assembly includes a solid baffle cap disposed above said disc so that when said contaminants dislodge from said pump, said baffle cap prevents said contaminants from contaminating said disc.

3. The device of claim 2, wherein said baffle includes a plurality of concentric rings and said baffle cap has a plurality of bars coupled thereto and extending radially therefrom, said plurality of bars being coupled to said plurality of concentric rings.

* * * * *

UNITED STATES PATENT AND TRADEMARK OFFICE
CERTIFICATE OF CORRECTION

PATENT NO. : 6,286,453 B1
DATED : September 11, 2001
INVENTOR(S) : Grannen et al.

It is certified that error appears in the above-identified patent and that said Letters Patent is hereby corrected as shown below:

<u>Column 4, claim 1,</u>
Line 23, "comprising." should read -- comprising: --
Line 23, after the word "comprising:" the following should be inserted:

-- a baffle assembly, said baffle assembly being disposed in said chamber above said disc, above said ion source and below said pump, said baffle assembly having baffle;

wherein said baffle reduces said portion of said ion beam contacting said pump thereby reducing said forming contaminants on said pump. --

Signed and Sealed this

Sixteenth Day of April, 2002

Attest:

JAMES E. ROGAN
*Attesting Officer*     *Director of the United States Patent and Trademark Office*